United States Patent [19]
Schiltz et al.

[11] Patent Number: 5,152,868
[45] Date of Patent: Oct. 6, 1992

[54] ELASTOMER CONNECTOR FOR INTEGRATED CIRCUITS OR SIMILAR, AND METHOD OF MANUFACTURING SAME

[75] Inventors: André Schiltz, Meylan; Marie-Jeanne Bouzid, Grenoble, both of France

[73] Assignee: France Telecom, Paris, France

[21] Appl. No.: 664,342

[22] Filed: Mar. 4, 1991

[30] Foreign Application Priority Data
  Mar. 6, 1990 [FR] France .............................. 90 02781

[51] Int. Cl.⁵ ..................... B44C 1/22; B29C 37/00
[52] U.S. Cl. ...................... 156/643; 29/874; 156/633; 156/651; 156/655; 156/659.1; 156/902; 361/398; 428/209; 428/901
[58] Field of Search ............ 156/630, 633, 643, 651, 156/655, 659.1, 901, 902, 233; 361/398, 404, 408; 427/96-98; 428/601, 209, 901; 29/837, 846, 874; 174/250, 251, 254

[56] References Cited

U.S. PATENT DOCUMENTS

| | | | |
|---|---|---|---|
| 3,711,625 | 1/1973 | Dupuis | 156/261 X |
| 4,400,234 | 8/1983 | Berg | 156/634 |
| 4,606,787 | 8/1986 | Pelligrino | 156/233 X |
| 4,650,545 | 3/1987 | Laakso et al. | 156/233 X |
| 4,681,654 | 7/1987 | Clementi et al. | 156/630 |
| 4,964,948 | 10/1990 | Reed | 156/902 X |

FOREIGN PATENT DOCUMENTS

| | | |
|---|---|---|
| 72673 | 2/1983 | European Pat. Off. . |
| 310357 | 4/1989 | European Pat. Off. . |
| 3616493 | 11/1986 | Fed. Rep. of Germany . |
| WO89/12911 | 12/1989 | PCT Int'l Appl. . |

*Primary Examiner*—William A. Powell
*Attorney, Agent, or Firm*—Bell, Seltzer, Park & Gibson

[57] ABSTRACT

An elastomer connector is disclosed for integrated circuits or similar, comprising an elastomer material support on one face of which is formed a dense network of electro-conducting lines. Using photo-etching techniques and metal deposition on a layer of strippable material, which techniques are used for manufacturing integrated circuits, the lines may be given a very small width and very high conductivity.

11 Claims, 3 Drawing Sheets

ELASTOMER CONNECTOR FOR INTEGRATED CIRCUITS OR SIMILAR, AND METHOD OF MANUFACTURING SAME

BACKGROUND OF THE INVENTION

The invention relates to an elastomer connector for integrated circuits or similar, as well as the method of manufacturing such a connector.

Electric connectors already exist for integrated circuits or similar, which comprise an elastomer material support on which electro-conducting lines of small width are formed, for providing electrical connections between input/output conductors of integrated circuits, hybrid circuits, test, supply or control circuits, etc . . . For that it is sufficient for these connectors to be positioned correctly on or between the circuits to be connected together and for their conducting lines to be applied with pressure on the input/output conductors of these circuits.

Such connectors have a number of advantages with respect to conventional connectors: they offer a great density of conducting lines per unit of length, they may be used in a wide temperature range, they withstand shocks and vibrations, they may be fitted and removed a very large number of times without damage, and they withstand numerous chemical agents (the silicon based elastomers withstand in particular oxygen, ozone and ultra-violet rays). The flexible nature of the elastomer support also makes it possible to connect together circuits which are not exactly at the same level, by slight flexion of this support.

Known connectors of this type have however some disadvantages:
- when the electro-conducting lines are formed by diffusion of carbon or silver in the elastomer of the support, they have a limited conductivity, and a width of at least 25 microns,
- when these electro-conducting lines are made by laminating a conducting grid (copper, gold, etc . . . ) on the elastomer support, they have good conductivity but their width is at least 100 microns,
- they only have a single level of conducting lines,
- the methods of manufacturing them may be relatively complex and expensive, particularly when these connectors are formed of a stack of thin layers alternately respectively conducting and insulating, which may have each a thickness of about 50 microns.

The purpose of the invention is in particular to palliate these different disadvantages of prior known connectors.

For this it provides an electric connector of the above type, comprising an elastomer support on which the electro-conducting lines of small width are formed, in which the lines may have excellent electric conductivity with widths which may be reduced to a micron.

A further object of the invention is to provide a connector of this type, which has different superimposed levels of electro-conducting lines.

The invention also has as object a connector of this type which may be manufactured by a relatively simple and inexpensive method, employing proved techniques used up to now in micro-electronics for manufacturing integrated circuits and hybrid circuits for example.

SUMMARY OF THE INVENTION

The invention provides, for this purpose, an elastomer connector for integrated and hybird circuits or the like, comprising an elastomer material support on which electro-conducting lines of small width are formed, whose ends are intended to be connected by pressure contact to input/output conductors of such integrated circuits, characterized in that these electro-conducting lines are solid and continuous metal conductors, partially embedded in the elastomer material support and having minimum widths of about one micron.

The minimum thicknesses of these electro-conducting lines are about five microns.

An extremely dense network of electro-conducting lines may thus be obtained having very low resistivity because they are formed by solid and continuous metal conductors such as copper or aluminum. The connectors of the invention are then particularly well adapted to form connection assemblies on hybrid circuits carrying several integrated circuits with a high number of input/output conductors.

Advantageously, the elastomer material of the support is transparent, which facilitates accurate positioning of the connector with respect to an integrated circuit or a hybrid circuit.

According to another characteristic of the invention, the connector comprises at least two superimposed levels of electro-conducting lines, the upper level being separated from the lower level by a thickness of a dielectric polymer material and the electro-conducting lines of the lower level being connected to electro-conducting lines or zones of the upper level by electrically conducting metal studs passing through said polymer material thickness.

This superimposition of electro-conducting line levels further increases the density of connections on the connector according to the invention.

Of course, the polymer material inserted between two levels may also be transparent, like the elastomer material of the support for facilitating positioning of the connector of the invention.

The invention also provides a method of manufacturing a connector of this type, characterized in that it comprises in depositing on a face of the support a thin layer of strippable material such as polysiloxane, forming channels by photo-etching in this thin layer and in the underlying face of the support, depositing a thin electrically conducting metal layer on this strippable layer and in said channels of the support, then removing said strippable material layer from the support with the metal layer which covers it, so as to leave only the metal in said channels or grooves of the support for forming said electro-conducting lines.

The method of the invention allows the dimensions of the conducting lines, not only in width but also in thickness, to be fixed accurately, and very small dimensions to be given them if necessary, using the proved techniques applied up to now in the manufacture of integrated electronic circuits.

The method of the invention is therefore reliable, accurate and inexpensive to the extent that it may be put into practice using existing installations.

More precisely, the method of the invention consists in depositing a photo-sensitive resin layer on the strippable material layer, exposing this resin layer to light radiation of suitable kind through a mask, developing said resin layer, then etching said strippable material layer and then the face of the support before depositing the thin electro-conducting metal layer.

According to another characteristic of the invention, the method consists in depositing initially on said face of the support a thin intermediate layer of polymer material on which the thin layer of strippable material is then deposited, then etching this thin intermediate layer at the same time as said face of the support.

The presence of this thin intermediate layer of polymer material makes it possible in particular to adjust the height of the conducting lines with respect to said face of the support of the elastomer material.

After deposing the metal layer and removing the strippable material layer, it is possible in fact to subject this intermediate layer to an additional etching operation for reducing its thickness and thus adjusting the height of the conducting lines with respect to said face of the support.

According to a further characteristic of the invention, the method then consists in covering the face of the support, on which the electro-conducting lines are formed, with a thin layer of polymer material, forming in the above mentioned way by etching and metal deposition, electro-conducting studs which pass through this thin layer and are connected to said electro-conducting lines, then depositing a new thin layer of polymer material and forming therein, by etching and metal deposition as mentioned above, a new series of electro-conducting lines and zones, some of which are connected to said studs.

Thus a connector is formed in a simple way having two levels of electro-conducting lines. By repeating the above operations, a connector is obtained having several levels of superimposed electro-conducting lines.

BRIEF DESCRIPTION OF THE DRAWINGS

The invention will be better understood and other characteristics, details and advantages thereof will be clear from the following description, given by way of example, with reference to the accompanying drawings in which.

DESCRIPTION OF THE PREFERRED EMBODIMENT

Figure 1:
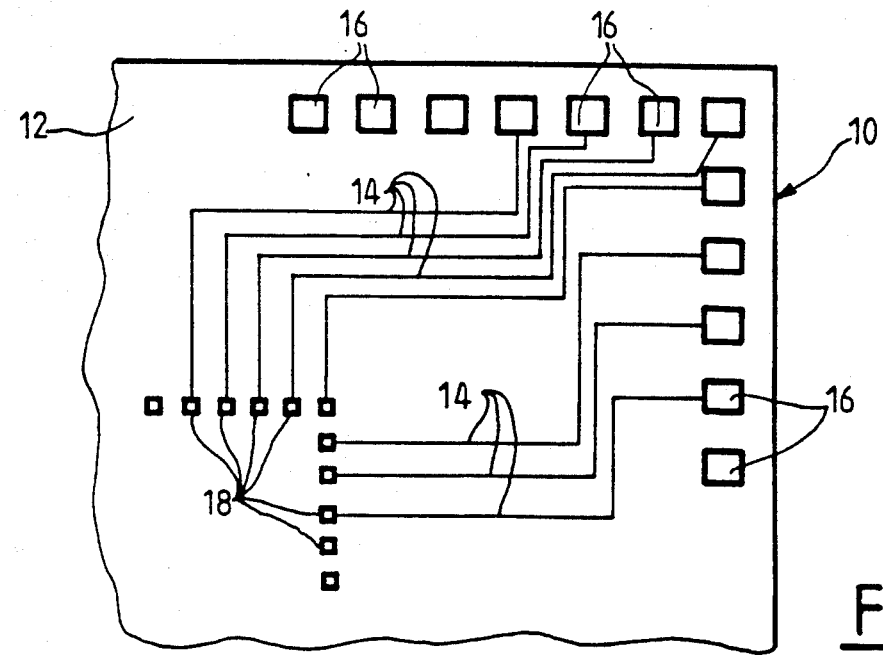
FIG. 1 is a partial schematic view of a connector according to the invention.
Figure 2:
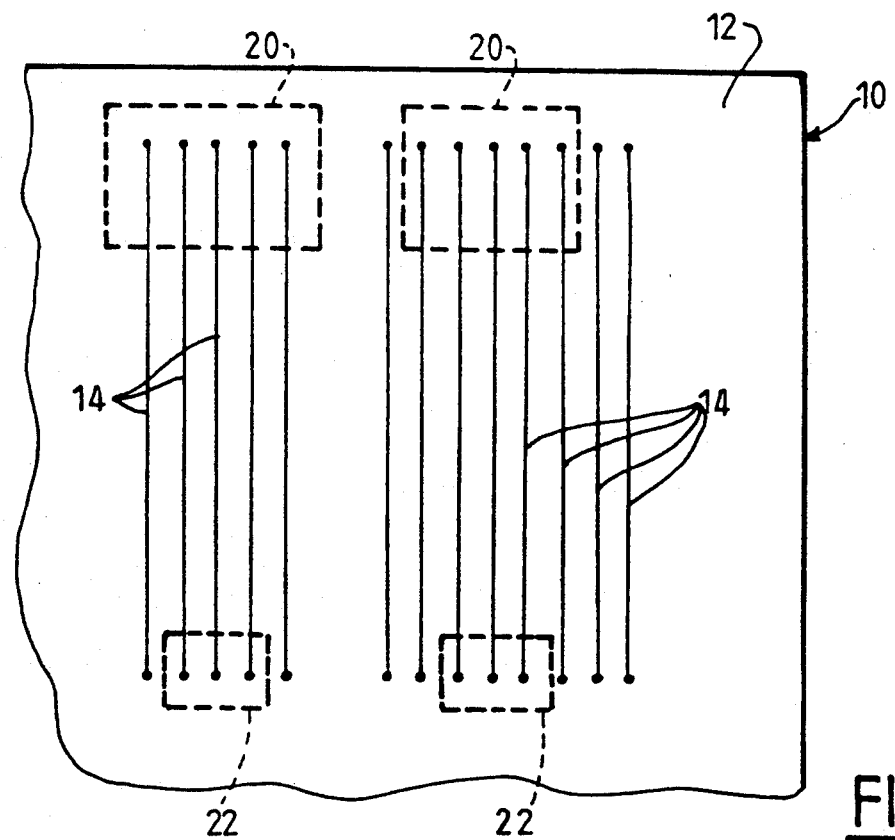
FIG. 2 is a partial schematic view of a modification of this connector.

Reference will be made first of all to FIGS. 1 and 2, in which two possible embodiments of a connector according to the invention have been shown schematically.

The connector of FIG. 1 comprises an elastomer material support 10, which may have a thickness of about 2 mm for example, on one face 12 of which electro-conducting lines 14 are formed connecting contact zones 16, 18 together in twos, some of which are formed along the edges of the support 10 and the others along the sides of a location of a hybrid circuit or integrated circuit.

According to the invention, the electro-conducting lines 14 may have a width as small as a micron and a thickness of a few microns. In practice, the width of lines 14 may have any desired value as a function of the contemplated use, for example a width of 5, 10, 25, 50 or 100 microns.

Since these electro-conducting lines 14 are formed by solid and continuous metal conductors, made for example from copper, aluminium, silver or gold, they have a very high conductivity.

The connector of the invention, shown schematically in FIG. 2, also comprises an elastomer material support 10, on one face 12 of which series of electro-conducting lines 14 are formed for connecting together conductors 20, 22 shown with broken lines, some of which are formed on a test card for example and the others of which are input/output conductors of a hybrid circuit or an integrated circuit.

Since the electro-conducting lines 14 have a width which may be very much less than that of conductors 20, 22, it is possible to have several lines 14 for each pair of conductors 20, 22 and thus provide redundant connections between these conductors, which makes it possible to position the connector easily on the components to be connected. Furthermore, the redundancy of connections is a guarantee that the desired electrical connections will be established.

The elastomer material support 10 may be made from fluorine-containing rubber, non transparent, or from a silicon based elastomer (transparent) for facilitating accurate positioning of the connector.

Reference will now be made to FIGS. 3a to 3g which show schematically the essential steps of a method of manufacturing a connector according to the invention.

Figure 3A:
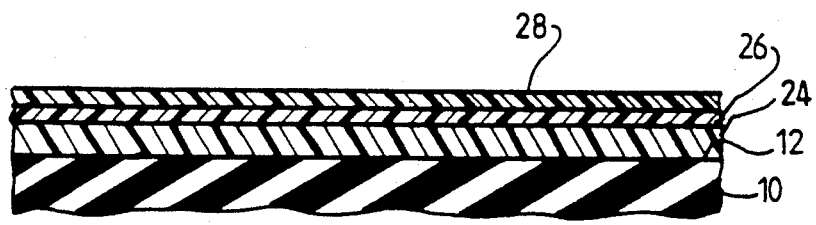
FIGS. 3a to 3g illustrate schematically the main steps of a method for manufacturing a connector according to the invention.
Figure 3B:
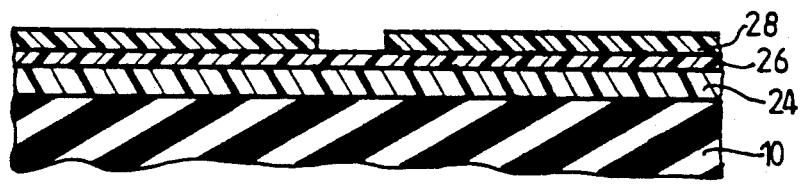
Figure 3C:
Figure 3D:
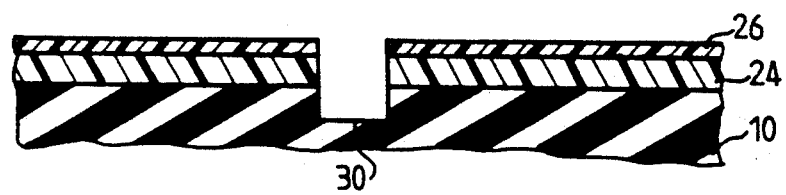
Figure 3E:
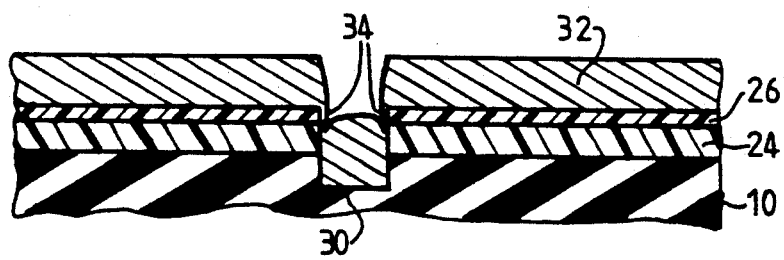

In FIG. 3a reference 10 designates, as in FIGS. 1 and 2, the elastomer material support whose face 12 is covered with a thin intermediate layer 24 of polymer material (for example transparent epoxy resin). This layer 24 is itself covered with a thin layer 26 of strippable material (generally called lift-off layer) such as polysiloxane for example.

On this layer 26 is finally deposited a thin layer 28 of a photo-sensitive resin.

The elastomer material support 10 may have a thickness of about 2 mm, whereas the intermediate layer 24 has a thickness of about 2 to 3 microns, the lift-off layer 26 a thickness of about 0.3 to 0.5 micron and the photo-sensitive resin layer 28 a thickness of 1 to 1.5 micron.

The first step of the method of the invention consists in subjecting this photo-sensitive resin layer 28 to insolation, by exposing it to an appropriate light radiation, for example ultra-violet radiation, through a mask defining the network of electro-conducting lines 14 to be formed on face 12 of support 10. Such insolation of the photo-sensitive resin is followed by an operation for developing the resin, so as to obtain the structure shown in FIG. 3b.

The method of the invention then consists in etching the network of electro-conducting lines 14 in the lift-off layer 26 (FIG. 3c) by means of a sulphur hexafluoride (FS6) plasma, then in the intermediate layer 24 and support 10 (FIG. 3d) by means of an oxygen rich plasma.

With such etching, channels or grooves 30 are formed in face 12 of support 10 in which the electro-conducting lines 14 will be partially embedded.

The following steps of the method of the invention consist (FIG. 3e) in depositing a thin layer 32 of the chosen metal on the support thus prepared, i.e. inside the channels or grooves and on the lift-off layer 26. The thickness of the metal layer 32 is for example greater than or equal to about 5 microns, so as to fill the channels or grooves 30 over a height corresponding substantially to the level of the upper face of the intermediate layer 24.

The metal is deposited by any appropriate technique, for example by evaporation or by spraying or else by thin layer spraying with thickening of the layer by electro-chemical growth, or else by chemical vapor deposition.

Of course, elastomer material of support 10 and the polymer material of the intermediate layer 24 are chosen so as to withstand the temperatures at which the metal is deposited, i.e. temperatures from about 150° to 250° C.

Figure 3F:
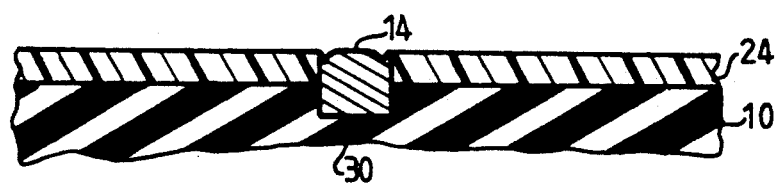
Figure 3G:
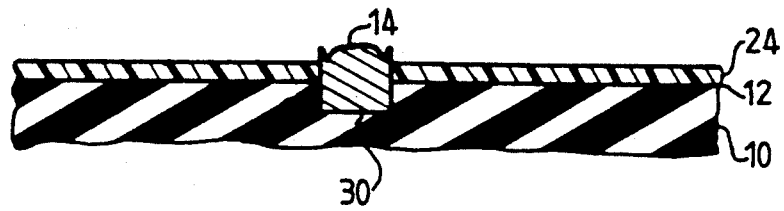

The next step of the method is shown in FIG. 3f and consists in removing the lift-off layer 26, as well as the metal layer 32 which covers it. That may be achieved mechanically (dipping in liquid nitrogen, causing destratification of layer 23 by differential thermal expansion between this layer, on the one hand, and the intermediate layer 24 and support 10 on the other) or chemically (by means of a dilute hydrofluoric acid solution which attacks the material of layer 26).

If required, limited chemical etching of the metal layer may be carried out previously, so as to break the bridges 34 of small thickness which connect together the metal filling the channels or grooves 30 and the metal layer 32 formed on the lift-off layer 26.

The metal which fills the channels or grooves 30 thus forms said electro-conducting lines 14.

The height of these lines 14 with respect to face 12 of support 10 may be adjusted by additional etching of the intermediate layer 24, for reducing its thickness, by means of a oxygen rich plasma. If necessary, all the material of layer 24 may be eliminated.

The method shown in FIGS. 3d to 3g thus allows a connector to be obtained such as the one shown in FIG. 1 or FIG. 2, having a single level of electro-conducting lines. It will however be readily understood that by repeating this method, a connector may be obtained having several superimposed levels of conducting lines.

For that the procedure shown schematically in FIGS. 4a to 4e may be used.

Figure 4A:
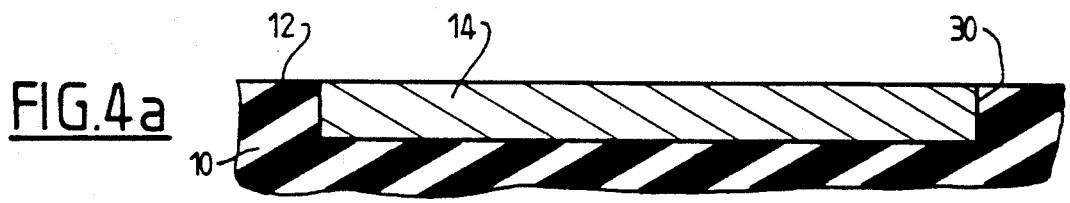
FIGS. 4a to 4e illustrate schematically the main steps of a variant of this method.

In FIG. 4a, an elastomer material support 10 has been shown, one face 12 of which comprises a network of electro-conducting lines 14, formed of solid and continuous metal conductors which are embedded in support 10, i.e. the upper face of the electro-conducting lines 14 is substantially at the level of the upper face 12 of support 10.

These electro-conducting lines 14 have been formed on support 10 using the method which has just been described with reference to FIGS. 3a to 3g, the height of the channels or grooves 30 receiving the electro-conducting lines 14 and 30 being however calculated so that these lines 14 do not substantially project above support 10.

Figure 4B:
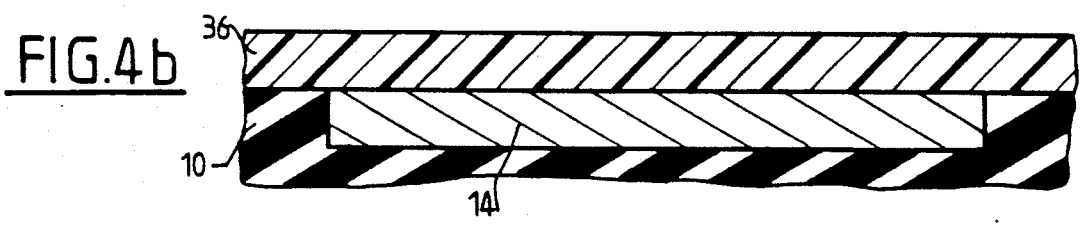
Figure 4C:
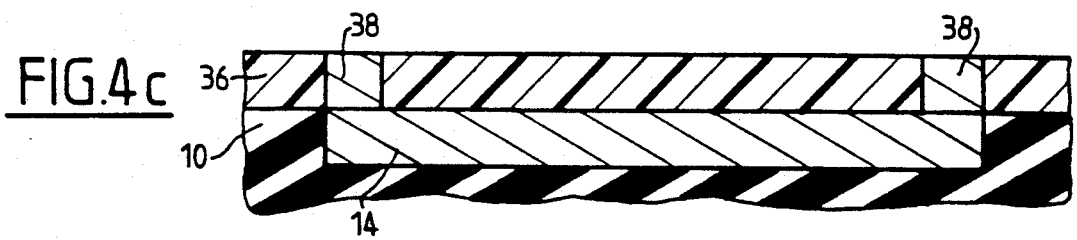

The following step of the method, shown in FIG. 4b, consists in depositing on support 10 a thin layer 36 of polymer material, for example the material used for the intermediate thin layer 24. This layer 36 may have a thickness of about 5 microns, for example. The following steps of the method consists in forming in this layer 36 metal conducting studs which are connected to the electro-conducting lines 14 and which extend over the whole thickness of layer 36, to emerge on the upper face thereof. This etching of layer 36 and deposition of metal forming studs 38 are carried out by the steps of the method shown in FIGS. 3a to 3f.

Figure 4D:
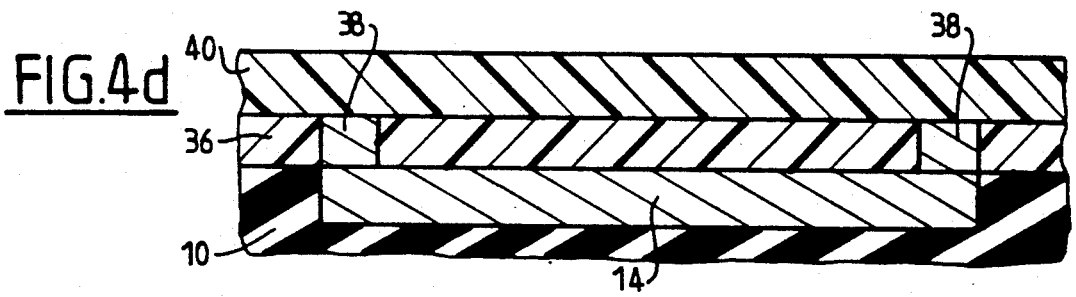
Figure 4E:
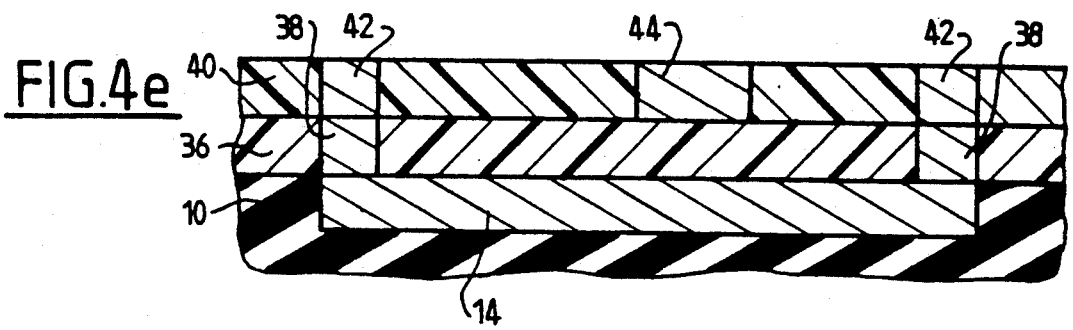

The next step, shown in FIG. 4d, consists in depositing a new layer 40 of polymer material on said layer 36 and the connecting studs 38. The polymer material of layer 40 may of course be the same as that of layer 36.

Then said etching and metal deposition operations are repeated so as to form in this layer 40, on the one hand, contact lines or areas 46 which are connected to the contact studs 38 and, on the other hand, another network of electro-conducting lines 44 some at least of which will cross the lines 14 of the lower level, while being separated therefrom by the polymer material layer 36.

A final etching operation with oxygen rich plasma reduces the thickness of layer 40 so as to cause the zones and lines 42, 44 to emerge partially.

Thus, an electric connector is obtained having two levels of conducting lines 14, 44.

By repeating the steps of FIGS. 4b to 4e, it is of course possible to obtain a connector with several superimposed levels of conducting lines which cross each other. Such a connector is useful in particular when the number of points to be connected together is very high and/or when crossing of the interconnection lines is unavoidable, for example in the case of circuits whose contact points are distributed on a entire surface or on concentric surfaces.

Generally, the advantages of the invention are the following:
- the electro-conducting connecting lines may be very fine (width greater than or equal to 1 micron) with a very low pitch (greater than or equal to 5 or 10 microns),
- these electro-conducting lines have a very high conductivity,
- several superimposed layers of connections may be formed,
- the manufacturing method is reliable and uses techniques and means proved in the manufacture of integrated circuits,
- it is generally faster and less expensive than the methods of manufacturing comparable connectors in the prior art,
- the connector according to the invention can be used not only for connections to circuits having a large number of inputs/outputs but also for testing these circuits, the contacts between the conductors of the connector and those of the circuits being provided by mechanical pressure.

What is claimed is:

1. Elastomer connector for integrated and hybrid circuits, comprising an elastomer material support on which electro-conducting lines are formed, whose ends are intended to be connected by pressure contact to input/output conductors of such circuits, wherein said electro-conducting lines are solid and continuous metal conductors, partially embedded in the elastomer material support and having minimum widths of about one micron.

2. Connector as claimed in claim 1, wherein the minimum thicknesses of the electro-conducting lines are of about five microns.

3. Connector as claimed in claim 1, wherein the minimum pitch of the electro-conducting lines is of about five microns.

4. Connector as claimed in claim 1, wherein the elastomer material of the support is transparent.

5. Connector as claimed in claim 1, comprising at least two superimposed levels of electro-conducting lines, the upper level being separated from the lower level by a thickness of a dielectric polymer material, the electro-conducting lines of the lower level being connected to electro-conducting lines and zones of the upper level by electrically conducting metal studs passing through said polymer material thickness.

6. Connector as claimed in claim 5, wherein said polymer material is transparent.

7. Method of manufacturing an elastomer connector for integrated and hybrid circuits, comprising an elastomer material support on which electro-conducting lines are formed, said method comprising depositing on a face of the support a thin layer of strippable material, forming channels by photo-etching in this thin layer and in the underlying face of the support, said channels having a minimum width of about one micron, depositing a thin electrically conducting metal layer on this strippable material layer and in said channels of the support, then removing said strippable material layer with the metal layer which covers it from the support so as to leave only the metal in said channels of the support for forming said electro-conducting lines.

8. Method as claimed in claim 7, wherein said step of forming channels by photo-etching comprises depositing a photo-sensitive resin layer on the strippable material layer, exposing this resin layer to light radiation of suitable kind through a mask, developing said resin layer, then etching said strippable material layer and then the face of the support before depositing the thin electro-conducting metal layer.

9. Method as claimed in claim 7, comprising in depositing initially on said face of the support a thin intermediate layer of polymer material on which the thin layer of strippable material is then deposited, then etching this thin intermediate layer at the same time as said face of the support.

10. Method as claimed in claim 9, wherein, after deposition of the metal layer and removal of the strippable material layer, said intermediate layer is subjected to an additional etching operation for reducing its thickness.

11. Method as claimed in claim 7, comprising the further steps of covering said face of the support, on which the electro-conducting lines are formed, with a thin layer of polymer material, forming in the above mentioned way by etching and metal deposition, electro-conducting studs which pass through this thin layer and are connected to said electro-conducting lines, then depositing a new thin layer of polymer material and forming therein, by etching and metal deposition as mentioned above, a new series of electro-conducting lines and zones, some of which are connected to said studs.

* * * * *